United States Patent [19]

Nicklaus

[11] 4,058,246

[45] Nov. 15, 1977

[54] SUCTION PIPETTE AND METHOD OF MANUFACTURE FOR RECEIVING OF SEMICONDUCTOR CRYSTAL PLATES

[75] Inventor: Karl Nicklaus, Steinhausen, Switzerland

[73] Assignee: Esec Sales S.A., Zug, Switzerland

[21] Appl. No.: 732,103

[22] Filed: Oct. 13, 1976

[30] Foreign Application Priority Data

Oct. 16, 1975 Switzerland ..................... 13454/75

[51] Int. Cl.$^2$ ......................... H01L 21/68; B22F 7/06
[52] U.S. Cl. ............................... 228/121; 228/44.1 A; 228/172; 75/208 R; 29/420.5; 294/64 R
[58] Field of Search ................. 228/6 A, 44.1 A, 121, 228/122; 29/420.5; 75/208 R; 294/64 R, 64 A, 64 B

[56] References Cited

U.S. PATENT DOCUMENTS

| | | | |
|---|---|---|---|
| 3,429,700 | 2/1969 | Wiegand et al. | 75/208 R |
| 3,479,716 | 11/1969 | Zanger, Jr. | 294/64 R X |
| 3,551,991 | 1/1971 | Reich et al. | 75/208 R X |
| 3,591,915 | 7/1971 | Roberts et al. | 29/420.5 X |
| 3,695,502 | 10/1972 | Gaiser | 228/6 A |

*Primary Examiner*—Al Lawrence Smith
*Assistant Examiner*—K. J. Ramsey

[57] ABSTRACT

A method of manufacturing a suction pipette of sinterable material for receiving substantially rectangular, semiconductor crystal plates. The pipette is formed with a rectangular recess and has walls defining the recess which narrow towards the floor of the recess; an evacuation channel communicates with the floor. The method includes the steps of inserting a binder into the material to be sintered, and fabricating first and second parts for assembly of the pipette, the first part being formed with an open channel and having sidewalls defining the channel. The second part is insertable into the first part and has cam-shaped end projections formed with respective inner walls, and outer walls for making contact with the sidewalls upon insertion of the second part into the first part. The method additionally includes grinding the sidewalls of the first part within the region of the open channel and the outer walls of the projections to a predetermined tapered angle for at least a first portion of the sidewalls, and the outer walls to fittingly abut each other, and heat treating the first and second parts upon insertion of the second part into the first part for uniting the first and second parts by diffusion of the binder within the sinterable material.

7 Claims, 2 Drawing Figures

SUCTION PIPETTE AND METHOD OF MANUFACTURE FOR RECEIVING OF SEMICONDUCTOR CRYSTAL PLATES

BACKGROUND OF THE INVENTION

The present invention relates to a method for manufacturing a suction pipette, for receiving rectangular, in particular quadratic semiconductor crystal plates, the pipette being made of synthetic material and having a rectangular or quadratic recess with sidewalls narrowing towards the floor of the recess, and an evacuation channel communicating with the floor of the recess.

DESCRIPTION OF THE PRIOR ART

Suction pipettes of the previously described kind, which are also denoted as pyramidal holders, serve to receive individual semiconductor crystal plates from a formation of very many crystal plates, for feeding them to a predetermined position of a processing machine, which mounts the crystal plates on a housing or a carrier, and provides them with respective connection leads. Since the requirements pertaining to accuracy and positioning of the semiconductor crystal plate by the machine mounting the latter keep constantly increasing in the semiconductor industry, the foremost problem has been to fabricate a recess in the suction pipette in the form of a truncated pyramid, the suction pipette being made of sintered material, for example hard metal or ceramics. Known methods for the manufacture of suction pipettes have relied on fabricating the recess by means of spark erosion from the sintered material, or by compressing the material appropriately prior to sintering. Most known methods have the disadvantage that the geometry of the recess is insufficiently precise, and the recess not adequately uniform, so that the semiconductor crystal plates are imprecisely positioned in the suction pipette due to a changeable position, or are damaged on being received by the pipette in view of a non-uniform formation of the recess.

OBJECT OF THE INVENTION

It is an object of the present invention to create a method for the manufacture of the suction pipette of the aforesaid kind, which allows a grinding of the surfaces of the suction pipette defining the recess, and therefore permits the manufacture of arbitrarily accurate and uniform supporting and adhesive surfaces of the semiconductor crystal plates, the surfaces being very fine or even.

SUMMARY OF THE INVENTION

The method, according to the present invention, is characterized by the suction pipette consisting of two parts of synthetic material, one part being manufactured with an open channel, the side walls of which are made to be inclined at a predetermined angle within the region of the open channel side, the other part being fabricated as an insert member insertable into that channel. The other part is provided on a side corresponding to the open channel side with cam-like projections on both end regions of that side, the inner sides being inclined at the same angle, so that upon insertion of the insert member into the channel, the insert member abuts the walls defining the channel, and defines or limits the recess together with the inclined surfaces of the part containing the channel, whereby the surfaces of the part containing the channel and the surfaces of the insert member, which come into contact with one another and define the recess, are appropriately dimensioned by grinding of the synthetic material, and the separate components are subjected to heat treatment upon insertion of the insert member into the channel in order to unite both parts by diffusion or melting of a binder contained in the synthetic material.

BRIEF DESCRIPTION OF THE DRAWINGS

The method, according to the invention, is further illustrated by means of an embodiment of the fabricated suction pipette shown in the drawing by way of an example.

DESCRIPTION OF THE PREFERRED EMBODIMENTS

Figure 1:
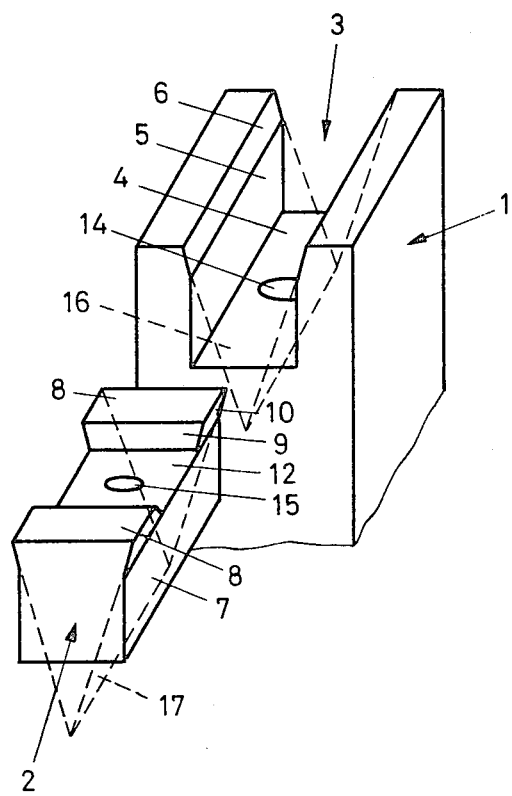
FIG. 1 shows the two separately manufactured parts of the suction pipette prior to the assembly.

Two parts 1 and 2 of a suction pipette shown in FIG. 1 are initially fabricated for the manufacture of a suction pipette for use with rectangular, and particularly quadratic semiconductor crystal plates. Part 1 has the form of a block manufactured of synthetic material, and is formed with a longitudinal and open channel 3. The sidewalls 5 of the channel extend initially perpendicularly upwards with respect to the floor 4. Both sidewalls have inclined surfaces within the region of the open channel side, the surfaces 6 being inclined at the same angle. The spacing, the height and the angle subtended by the inclined surfaces 6 corresponds to the dimensions of a pair of opposite outer walls of a block fitting into the desired recess formed in the suction pipette to be manufactured. The second part is fabricated as an insert member from the same synthetic material, so that it can be inserted into the channel 3 of the part 1, or slid thereinto. Part 2 includes a corresponding parallelipiped pedestal 7, whose dimensions are substantially identical with the section of the channel 3 of the part 1, defined by the floor 4, and the perpendicular sidewalls 5. The upper side of the pedestal 7 is formed at each end thereof with a projection 8, the projection 8 having inner surfaces 9 facing each other which are inclined at the same angle, and at the same height as the surfaces 6 of the part 1. The spacing of the inner sides 9 corresponds to the desired spacing of the other pair of opposite sidewalls of the recess of the suction pipette.

In the example illustrated, both front sides 10 of the projections 8 are also inclined at the same angle. Upon insertion of the part 2 into the channel 3 of the part 1, the surfaces 6 of the part 1 therefore abut on the inner sides 9 of the projection 8 of the part 2, forming respective edges 11, according to FIG. 2, and define together with the surface 12 of the part 2 disposed between the projections 8 a recess 13.

It can be further seen from FIG. 1 that part 1 is formed with a bore 14 extending from the floor 4, to which bore suction pump can be connected. Part 2 is formed with an appropriate through-going bore 15 between the projections 8. The part 2 is inserted into the part 1 in such a manner that the bores 14 and 15 are coaxially aligned.

Figure 2:
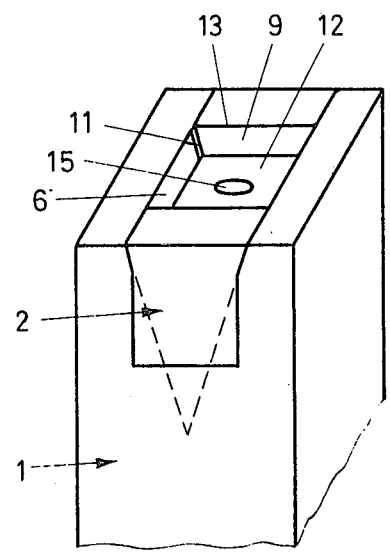
FIG. 2 shows the suction pipette following assembly of the two parts, and the subsequent heat treatment.

Upon insertion of the part 2 into the part 1 these parts are jointly subjected to a heat treatment at a temperature approximately corresponding to the original sintering temperature. This causes the binder contained in the synthetic material to diffuse or flow, so that the parts 1 and 2 are rigidly united, as shown in FIG. 2.

From FIG. 1 it can further be seen that the described geometric shape of the parts 1 and 2 easily permits processing by grinding. This permits the manufacture of the recess 13 with very precise dimensions, which in turn permits the semiconductor crystal plates to be received always in one and the same position, the crystal plates having only very small dimension tolerances. Since extremely uniform and smooth surfaces can be achieved by grinding of the inclined surfaces 6 and 9, damage of the crystal plates received by suction is practically avoided. The recess can be manufactured for semiconductor crystal plates having side lengths between 0.5 to 7 mm, the depth of the recess being in a region of 0.1 to 5 mm, corresponding to the thickness of the semiconductor crystal plate.

In order to also avoid damage to the edges of the semiconductor crystal plate upon the crystal plate being received in the recess 13, it is advantageous to form the edges 11 of the recess 13 with a groove. (see FIG. 2) This can be achieved by the parts 2 being dimensioned at least in their region of the edges 11 so as to form a gap having a width of at least 1–3 micrometers. The heat treatment is then accomplished at such a temperature and for such a duration, that the binder contained in the synthetic material of parts 1 and 2 fills the edge gap by diffusion or melting, but is partially sucked off by capillary action of the remaining separation gaps of the parts 1 and 2, so that grooves are formed in the edges 11.

In another embodiment, the part 2 can also be fabricated without any inclined front sides, i.e., with straight frontal sides. The recess 13 is then formed with a wide separation gap at the edges where the inclined surfaces 6 and 9 meet, which also prevents damage to the edges of the semiconductor crystal plate.

In another embodiment, the longitudinal open channel in part 1 can be formed with a V-shaped cross-section, as shown dotted in FIGS. 1 and 2. The sidewalls 16 of FIG. 1 of the channel 3 then form a V, their dimensions being substantially the same as those of the segment of the channel 3 of the part 1 defined by the inclined sidewalls 16.

The synthetic material of the parts 1 and 2 may be formed for example of tungsten carbide, titanium carbide, or aluminum oxide using metal, cobalt, glass, etc. as binders. The heat treatment of the assembled parts 1 and 2 is undertaken, for example, for 10 minutes at a temperature of 1600° C, preferably in a vacuum in the presence of an inert gas, for example argon or nitrogen.

The present invention is primarily applicable to the processing and testing of semiconductor plates or chips provided with active circuits and passive networks, for example, in integrated circuits including large-scale integration. The suction pipette serves as a holder for accurate positioning of a plate or chip to receive interconnection leads for the circuits and networks on the chip.

What is claimed is:
1. A method of manufacturing a suction pipette of sinterable material for receiving rectangular, including quadratic semiconductor crystal plates, the pipette being formed with a rectangular recess having a floor, walls defining the recess narrowing towards the floor, and an evacuation channel communicating with the floor, comprising the steps of:
    inserting a binder into the material to be sintered;
    fabricating first and second parts for assembly of the pipette, the first part being formed with an open channel and having first and second sidewalls defining the open channel, the second part being insertable into the first part having first and second cam-shaped end-projections formed with first and second inner walls, respectively, and first and second outer walls for making contact with the first and second sidewalls upon insertion of the second part into the first part;
    grinding the sidewalls of the first part within the region of the open channel and the outer walls of the projections to a predetermined tapered angle for at least a first portion of the first and second sidewalls, and the first and second outer walls to fittingly abut each other, respectively, upon the insertion of the second part into the first part, the inner walls and at least a second portion of the first and second sidewalls defining the recess; and heat treating or sintering the first and second parts upon insertion of the second part into the first part for uniting the first and second parts by diffusion of the binder within the sinterable material.

2. A method according to claim 1 further comprising the step of fabricating the first part with an open channel having an approximately rectangular cross-section.

3. A method according to claim 1 further comprising the step of fabricating the first part with an open channel having a V-shaped cross-section.

4. A method according to claim 1 further comprising the step of grinding the inner walls of the projections to the predetermined tapered angle for the transition of the inner walls to the sidewalls to be continuous upon insertion of the second part into the first part.

5. A method according to claim 4 further comprising the step of heat-treating the first and second parts at a temperature and for a time duration for grooves to form along the edges of the inner and outer walls, respectively.

6. A method according to claim 1 further comprising the steps of forming the first part with a bore communicating with the floor of the channel, forming the second part with a through-going bore formed between the projections, and aligning the bores upon insertion of the first part into the second part to form the evacuation channel.

7. A suction pipette comprising a first part formed with an open channel and having sidewalls defining the open channel, and a second part insertable into said first part, said second part having first and second cam-shaped projections formed with first and second inner walls, respectively, and first and second outer walls for making contact with said first and second sidewalls upon insertion of said second part into said first part, said first and second parts being made of sinterable material having a binder inserted therein, the sidewalls of the first part within the region of the open channel and the outer walls of the projections being ground to a predetermined angle for at least a first portion of the first and second sidewalls, and the first and second outer walls to fittingly abut each other, respectively, upon insertion of the second part into the first part, the inner walls and at least a second portion of the first and second sidewalls defining the recess, the suction pipette being formed by uniting the parts by diffusion of the binder with the sinterable material through heat treatment upon the first part having been inserted into the second part.

* * * * *